United States Patent [19]

Ogita et al.

[11] Patent Number: 5,451,886
[45] Date of Patent: Sep. 19, 1995

[54] METHOD OF EVALUATING LIFETIME OF SEMICONDUCTOR MATERIAL AND APPARATUS FOR THE SAME

[75] Inventors: Yoichiro Ogita, Aikawa; Tateo Kusama, Gorikida, both of Japan

[73] Assignees: School Judicial Person Ikutoku Gakuen, Kanagawa; Semitex Co., Ltd., Tokyo, both of Japan

[21] Appl. No.: 77,062

[22] Filed: Jun. 16, 1993

[30] Foreign Application Priority Data

Oct. 19, 1992 [JP] Japan .................. 4-306147

[51] Int. Cl.$^6$ .................. G01R 31/26
[52] U.S. Cl. .................. 324/767; 324/766; 324/765
[58] Field of Search .............. 324/158 D, 158 R, 767, 324/766, 765, 753

[56] References Cited

U.S. PATENT DOCUMENTS

| | | | |
|---|---|---|---|
| 4,704,576 | 11/1987 | Tributsch | 324/158 R |
| 4,949,034 | 8/1990 | Imura | 324/158 R |
| 5,047,713 | 9/1991 | Kirino | 324/158 R |
| 5,138,255 | 8/1992 | Kusama | 324/158 D |

OTHER PUBLICATIONS

Bueche, Frederick "Intro To Physics For Scientists and Engineers" p. 563 1975.

Primary Examiner—Kenneth A. Wieder
Assistant Examiner—Mark Wardas

[57] ABSTRACT

A method of and apparatus for evaluating the lifetime of a semiconductor material which is capable of measuring, in a non-contact and non-destructive manner, the lifetime of a surface thin-layer portion so as to evaluate the quality of a semiconductor device formed of an epitaxial wafer or a thin device-forming material. Light within a short-wavelength region is radiated for a short period of time on the surface of a semiconductor material to be evaluated, thereby generating carriers effectively on the surface and in a surface thin-layer. An electromagnetic wave within a millimeter to sub-millimeter wave region is projected onto the surface, and a wave reflected from the surface is measured to obtain a decay curve of the carriers. On the basis of the carrier decay curve, the lifetime of the surface as well as a surface thin-layer portion of the semiconductor material is evaluated.

6 Claims, 6 Drawing Sheets

BONDED WAFER

SIMOX

METHOD OF EVALUATING LIFETIME OF SEMICONDUCTOR MATERIAL AND APPARATUS FOR THE SAME

BACKGROUND OF THE INVENTION

1. Field of the Invention

This invention relates to an evaluation method of and measuring apparatus for the lifetime of a semiconductor material which, in the process of fabricating a semiconductor device, measures the lifetime of carriers generated by injecting energy into the semiconductor material to be measured, so that quality is evaluated in a non-contact and non-destructive manner.

2. Description of the Prior Art

In the process of fabricating semiconductor devices, high-density ICs, LSIs, etc. are fabricated by using silicon materials or the like. Generally, such a silicon material is in the form of a thin disk (of a thickness of below 900 $\mu m$) known as a silicon wafer, and has a cross-sectional structure in which defects are distributed, as shown in FIG. 6A (defects are represented by points). In the device fabricating process, a desired device is fabricated on the surface or in a layer close to the surface of such a wafer. Accordingly, the thickness of the wafer which is actually used lies within only several $\mu m$ from the surface, and the remaining thickness of the wafer, which amounts to several hundred $\mu m$, is used to impart a mechanical strength to the device fabricated on the wafer, and to perform gettering for the purpose of making silicon crystal in the device-fabricated portion non-defective, as shown in FIG. 6B. In recent years, in view of the fact that the actually used thickness of a silicon material is thin and for the purpose of improving the degree by which the surface layer is made non-defective, wafers of epitaxial structures have been produced in large quantities. In addition, various epitaxial structures, such as those shown in FIG. 7A to 7E, have been developed and have come into practical use with a view to attaining thin layers of higher purity and higher quality. FIG. 7A A shows a structure of a wafer generally referred to as an epitaxial wafer. FIG. 7B shows a structure referred to as a SOS structure, FIG. 7C shows a structure referred to as a SOl structure, FIG. 7D shows a structure referred to as a bonded wafer, and FIG. 7E shows a structure referred to as a SIMOX structure. These structures are generically referred to as epitaxial structures.

In recent years, as the density of memory devices has become increasingly high, the thickness of the actual device-forming material has been increasingly reduced. In this tendency of layer-thickness reduction, it has become necessary to enable evaluation of surface thin-layer portions of semiconductor materials having increasingly higher quality.

In order to enable the evaluation of crystal on the surface of such a semiconductor material and crystal in the silicon wafer bulk (the layer located sufficiently deeper than the surface layer) which forms a base for the surface, and to enable non-destructive evaluation in the fabrication process, the Applicants have previously developed non-contact and non-destructive lifetime measuring apparatuses employing laser and microwave (for example, Japanese Patent Laid-Open Nos.248081-1990 and 248082-1980, and Japanese Patent Application No.211122-1890). In such systems, microwave (of 10 GHz or lower) is radiated onto a silicon wafer from the surface thereof, and the reflection of microwave by carriers generated by a laser beam is measured so as to measure a lifetime on the basis of a carrier decay curve. Further, the lifetime of the surface or a layer in the vicinity of the surface and the lifetime of a deeper portion (the bulk) are separated from each other so as to enable crystal evaluation with respect to the surface and the bulk in a non-contact and non-destructive manner.

However, with such systems, it has been impossible to evaluate a thin layer of an epitaxial structure, such as that described before, in other words, it has been impossible to measure the lifetime of a thin layer. Lifetime measurement is impossible particularly in the case of an epitaxial wafer such as that shown in FIG. 7A. In this case, since a device is fabricated in a layer (referred to as an epitaxial layer) which is on the surface and which has a thickness t of several $\mu m$ and a resistivity $\beta$, of several $\Omega cm$ to several tens of $\mu m$, it is necessary to evaluate the lifetime of the epitaxial layer. However, the base portion of the wafer (generally referred to as an epitaxial sub-layer) has a low resistivity $\beta_2$ of 0.1 to 0.001 $\Omega cm$, which results in 100% of the microwave being reflected, thereby extremely lowering the S/N ratio of a lifetime signal obtained from the epitaxial layer. In the case of a SOS structure, (sapphire substrate of $Al_2O_3$) having an epitaxial layer thickness t of several such as that shown in FIG. 7B, the S/N ratio is extremely low due to a small amount of reflection of the microwave and the influence of surface recombination in the thin layer portion (which can also occur in the case of an epitaxial wafer), thereby making lifetime measurement impossible as in the case of an epitaxial wafer. In the case of a SOI structure, a SIMOX structure, and a bonded wafer each having an epitaxial layer thickness t of several to several tens of $\mu m$, an epitaxial layer resistivity $\beta_1$ of several to several tens of $\Omega$ cm and an epitaxial sub-layer resistivity $\beta_2$ of several to several tens of $\Omega$ cm, such as those shown in FIGS. 7C, 7E and 7D, respectively, although these structures do not hinder a lifetime signal from being obtained by a conventional system employing laser and microwave, it is impossible to accurately separate the lifetime signal concerning the surface thin-layer portion whose evaluation is particularly required. Thus, with the above systems, it has been impossible to measure the lifetime of, in particular, a surface thin layer in the case of wafers having the structures shown in FIGS. 7A to 7E.

SUMMARY OF THE INVENTION

This invention has been accomplished in view of the above circumstances. An object of this invention is to provide a method of and an apparatus for evaluating the lifetime of a semiconductor material which is capable of measuring the lifetime of a surface thin-layer portion in a non-contact and non-destructive manner so as to evaluate the quality of a semiconductor device formed of a wafer material of an epitaxial structure or a thin-film device-forming material.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1:
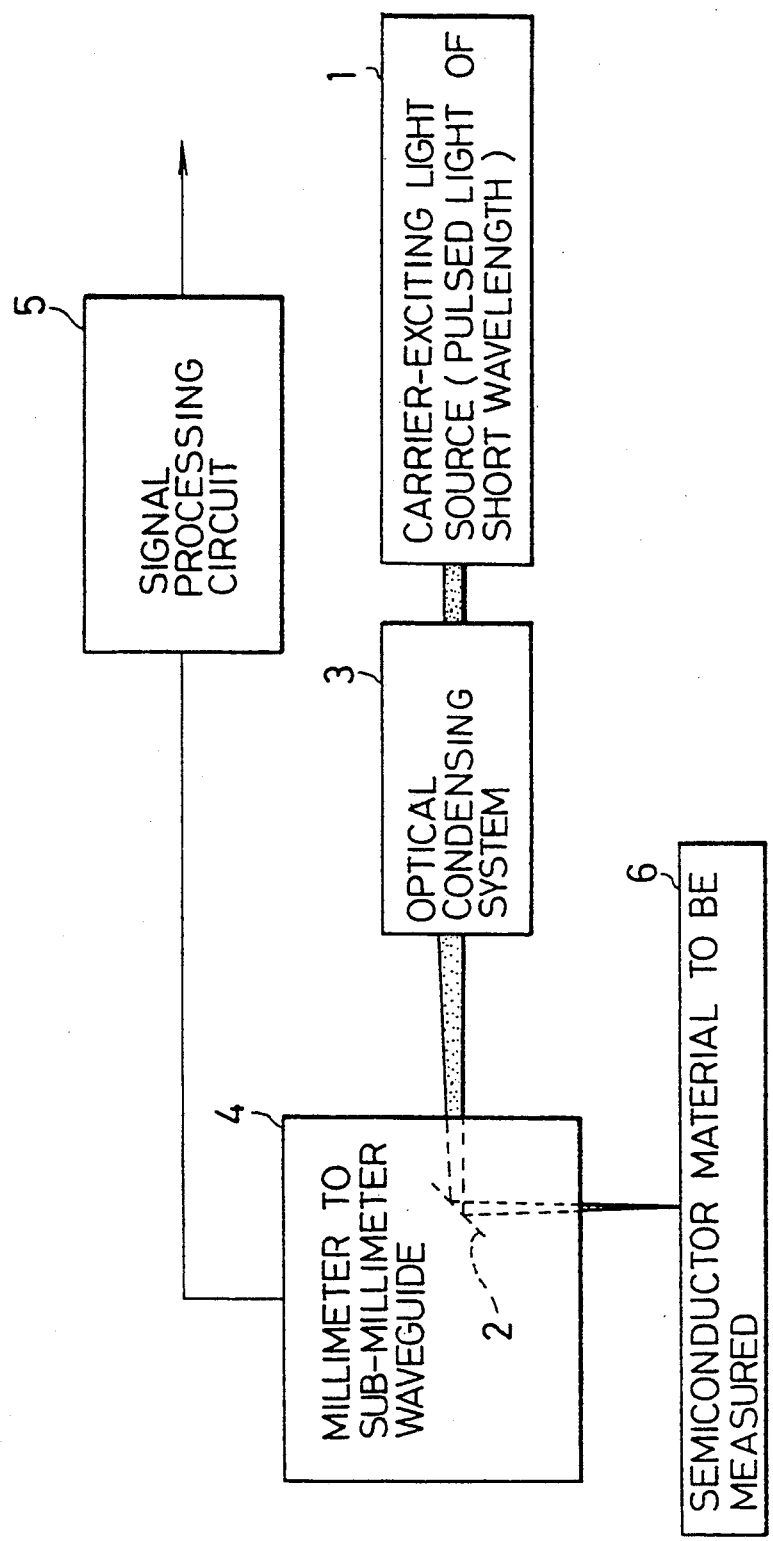
FIG. 1 is a diagram for explaining the fundamental for an embodiment of the present invention.

The fundamental arrangement of a lifetime evaluating system according to an embodiment of the present invention is shown in FIG. 1. A carrier-exciting light source 1 radiates pulsed light within a short-wavelength region for a period of time of not more than 1 nsec. The light is radiated through an optical condensation system 3 and a reflecting mirror 2 onto the surface of a semiconductor material 6 to be measured. The energy of short-wavelength light, which has thus been injected for a short period of time, excites carriers on the surface as well as in a surface thin-layer portion of the semiconductor material 6. On the other hand, a millimeter to sub-millimeter waveguide 4 always supplies an electromagnetic wave including a millimeter to sub-millimeter wave (corresponding to 30 to 3000 GHz) generated by an oscillator included in the millimeter to sub-millimeter waveguide 4 to the surface of the semiconductor material 6. The projected electromagnetic wave is reflected by that surface in an amount varying in proportion to the density of carriers. The reflected electromagnetic wave is detected by a detector built in the millimeter to sub-millimeter waveguide 4. The detected electromagnetic wave is signal-processed by a signal processing circuit 5, and output therefrom.

It will be understood that the thus obtained signal indicates the decay process of carriers on the surface of the semiconductor material to be measured or in a thin layer very close to the surface because carriers are effectively generated on the surface and in the surface thin-layer of the semiconductor material by pulsed light of a short wavelength which has been radiated for a short period of time, and because the electromagnetic wave used is a millimeter to sub-millimeter wave so that the electromagnetic wave penetrates into the surface thin-layer portion at least. When the exciting light source for radiating pulsed light for a very short period of time includes, for example, a $N_2$ laser, carriers thus generated are within a depth of several hundred Å from the surface and confined within the surface thin-layer portion due to the existence of a carrier in an epitaxial wafer or a $SiO_2$ layer. Information on the reflection of the electromagnetic wave which has been obtained by using such surface-generated carriers and such a millimeter to sub-millimeter electromagnetic wave indicates the behavior of carriers on the surface or in a surface thin-layer portion of a semiconductor material to be measured. Such carrier behavior provides a lifetime, or a material quality evaluation value.

Figure 2:
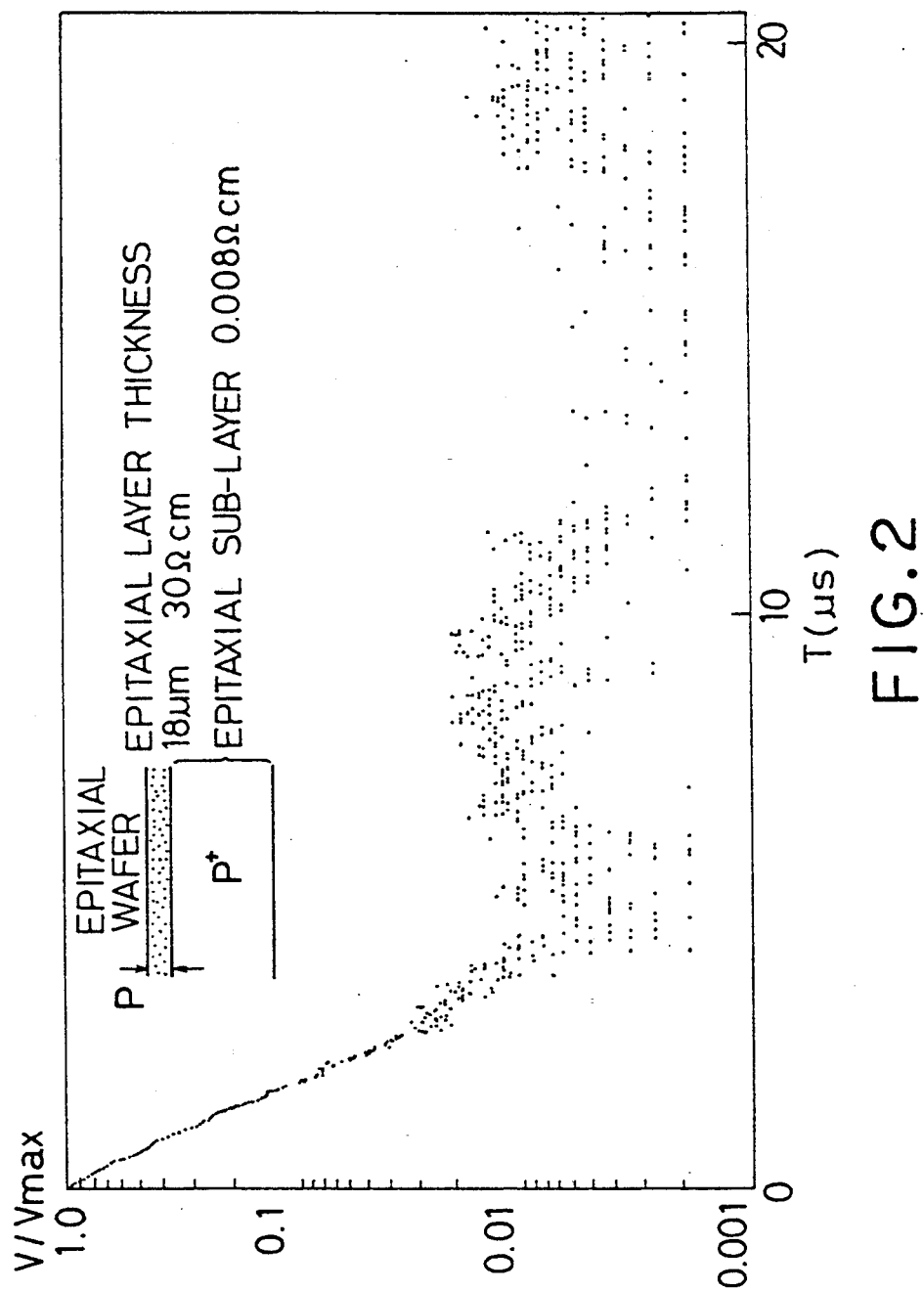
FIG. 2 is a graph showing an example of a lifetime curve obtained according to an embodiment of the present invention.
Figure 3:
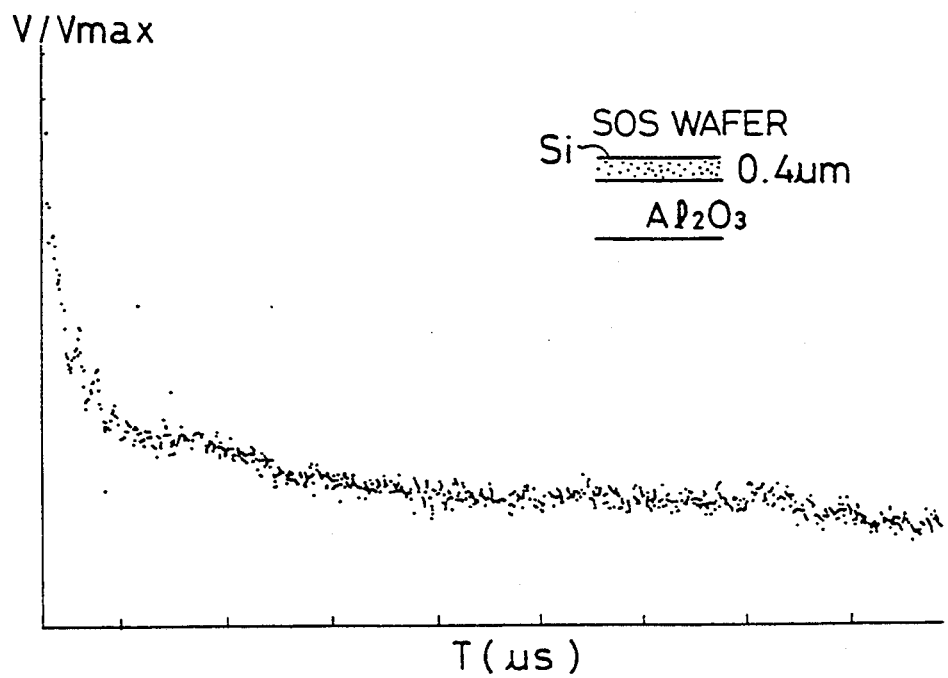
FIG. 3 is a graph showing another example of a lifetime curve obtained according to an embodiment of the present invention.
Figure 4:
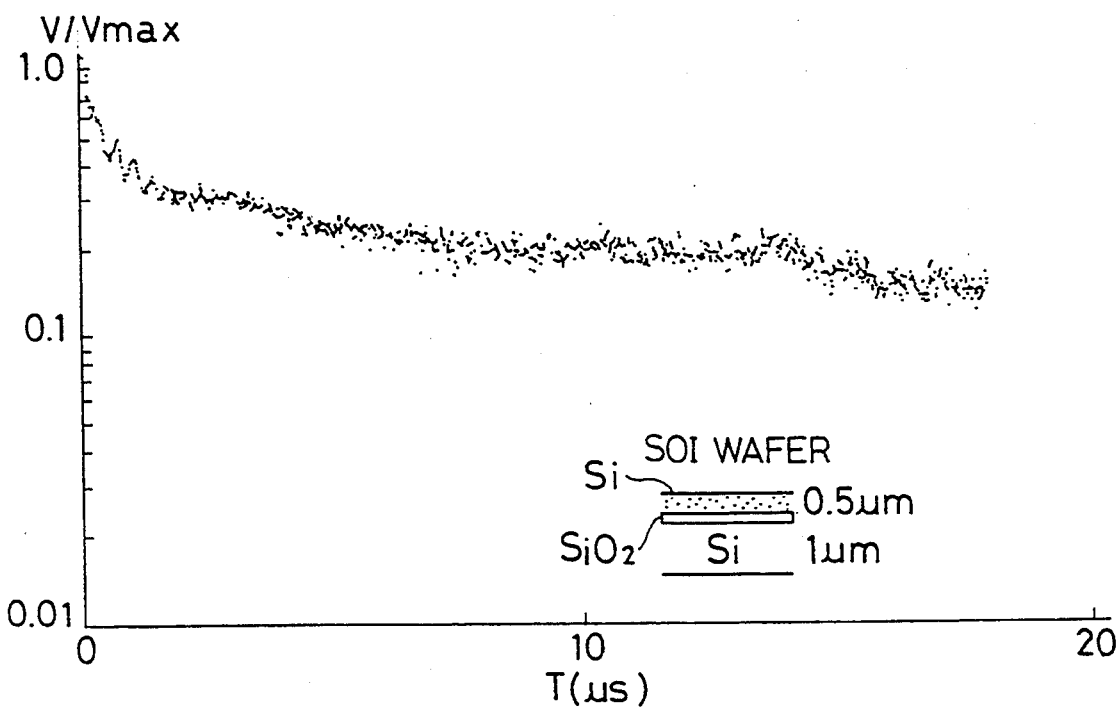
FIG. 4 is a graph showing a further example of a lifetime curve obtained according to an embodiment of the present invention.

FIG. 2 shows an example of a carrier decay curve (lifetime curve) of an epitaxial wafer (see FIG. 7A) which has been obtained by the above-described method. The epitaxial wafer used in this example consists of a p/p+type optaxial wafer having an epitaxial layer thickness of approximately 18 μm, an epitaxial layer resistivity of approximately 30 Ωcm, and an epitaxial sub-layer resistivity of approximately 0.008 Ωcm. FIGS. 3 and 4 show other examples of lifetime curves which have been obtained by the above-described system for an embodiment of the present invention by using a SOS sample (see FIG. 7B) and a SOI sample (see FIG. 7C), respectively.

According to the present embodiment, it is possible to measure the lifetime of the surface thin-layer portions (generally referred to as "the epitaxial layers") of wafers having epitaxial structures, such as those shown in FIGS. 7A through 7E, whose lifetime measurement has hitherto been impossible by a conventional laser-microwave method. According to the present embodiment, the crystal defects and the contamination level can be evaluated in a non-contact and non-destructive manner without using a dummy wafer as is used in the current practice.

Figure 5:
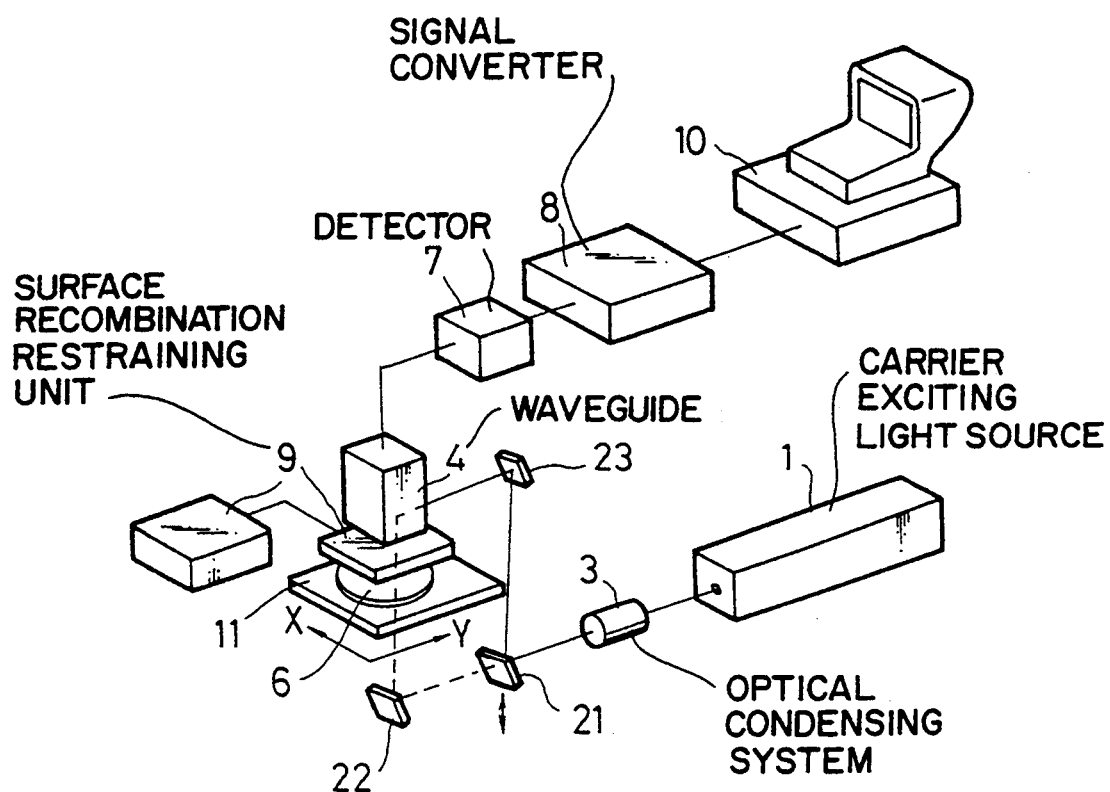
FIG. 5 is a view showing an example of a construction of a lifetime evaluating apparatus according to an embodiment of the present invention.
Figure 6A:
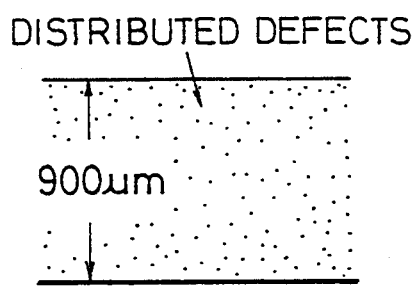
FIGS. 6A and 6B are views for explaining a cross-sectional structure of a general silicon wafer.
Figure 6B:
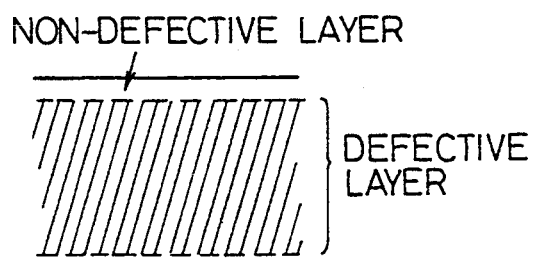
Figure 7A:
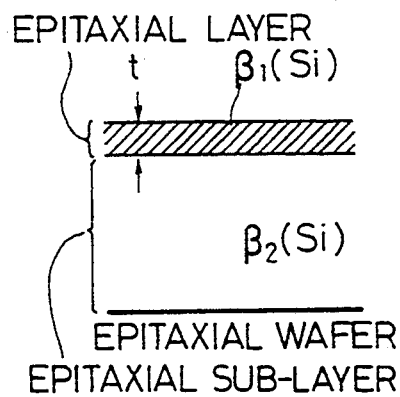
FIGS. 7A through 7E are views showing cross-sectional structures of wafers having various epitaxial structures.
Figure 7B:
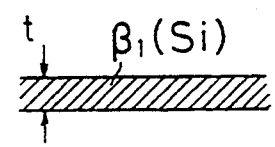
Figure 7C:
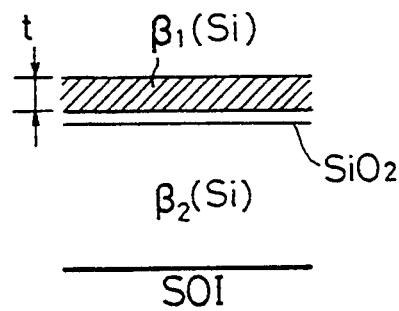
Figure 7D:
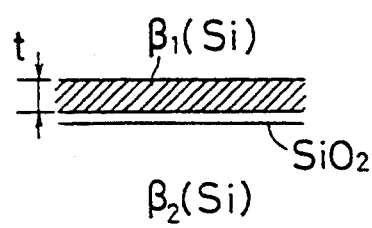
Figure 7E:
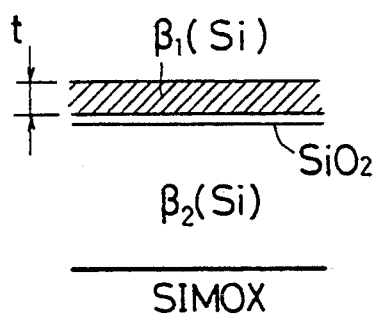

An example of a construction of a lifetime evaluating apparatus according to an embodiment of the present invention is shown in FIG. 5. As shown in FIG. 5, the apparatus includes: a sample stage 11 on which a semiconductor material 6 to be measured is placed; a carrier-exciting light source 1 for radiating pulsed light of a short wavelength; an optical condensation system 3 for condensing the pulsed light; reflection mirrors 21, 22 and 23 for reflecting the condensed light onto the surface of the semiconductor material 6 to be irradiated; a millimeter to sub-millimeter waveguide 4 for generating a millimeter to sub-millimeter wave, for projecting the wave onto the surface of the semiconductor material 8, and for guiding the wave reflected from that surface to a detector 7; a signal converter 8 for converting a detection value of the detector 7 into an electrical signal; and a CPU 10 for inputting the converted signal, and for performing data processing. Although in the illustrated example, the sample stage 11 includes an X-Y stage, the sample stage 11 may of course include a stage movable along the X axis and rotatable by an angle θ.

Where a semiconductor material 6 to be measured (hereinafter referred to as "sample") placed on the sample stage 11 includes, for example, an epitaxial wafer such as that shown in FIG. 7A, a SOI wafer such as that shown in FIG. 7C, a bonded wafer such as that shown in FIG. 7D, or a SIMOX wafer such as that shown in FIG. 7E, the surface thin-layer to be measured is on the upper surface of the sample. Therefore, the light from the carrier-exciting light source 1 is radiated through the optical condensation system 3 onto the surface of the sample after being reflected by the reflecting mirrors 21 and 23. That is, where the thin layer to be measured is based on a silicon portion to serve as a substrate, since light cannot be radiated from the side of the silicon substrate-portion (from the lower surface of the sample), light is radiated for energy injection from the upper surface of the same by using the mirrors 21 and 23. On the other hand, where a sample to be measured includes a SOS sample such as that shown in FIG. 7B, since a silicon thin layer is formed on a sapphire portion to serve as a substrate, the energy of light can be either injected from the upper surface of the sample, or injected into the silicon layer through the sapphire substrate-portion, which is transparent, by using the mirror 22 without using the mirror 21.

Carriers are efficiently generated in a surface thin-layer of a sample bs such optical excitation. On the other hand, the surface of the sample is always supplied with a millimeter to sub-millimeter wave projected thereon from the millimeter to sub-millimeter wave projected thereon from the millimeter to sub-millimeter waveguide 4. The projected wave is reflected in an amount in proportion to a carrier density. Since the millimeter to sub-millimeter wave penetrates only to a shallow depth, the reflection signal obtained from the reflected wave provides information on a portion very close to the surface. Thus, it is possible to evaluate a crystal in the surface thin layer.

The apparatus shown in FIG. 5 also comprises a surface recombination restraining unit 9 for restraining recombination on the surface of a semiconductor material, because recombination is one of the most significant factors influencing on the decay process of generated carriers. Specifically, the surface recombination restraining unit 9 includes a negative bias application unit for generating negative ions on the surface or in the vicinity of the surface of a portion of the sample where carriers are to be generated, or a strong electric-field forming power-supply unit utilizing a natural oxide film on the surface of the sample. In this way, it is possible to restrain carriers from decaying due to surface recombination, thereby making it possible to obtain a signal which is stable and which has a high S/N ratio.

As described above, a method of and an apparatus for evaluating the lifetime of a semiconductor material according to the embodiment of the present invention enables the kind of measurement that has been impossible with a conventional lifetime evaluation system of the non-contact non-destructive type because of the particularities of the epitaxial structures in comparison with a single-crystal silicon wafer and of the principles of the conventional system (i.e., the use of laser and microwave), owing to adopt a high-luminance short-wavelength light source (including a laser) and a millimeter to sub-millimeter wave.

Further, the embodiments of the present invention makes it possible to control surface recombination which has caused a problem to a conventional lifetime measurement system of the optical excitation type. Still further, the system according to the embodiments of the present invention can be applied to measurement in a manner similar to that of a conventional system even in the case of measuring single-crystal silicon wafers currently available, and will be sufficiently usable to evaluate surface thin-layers whose quality and degree of non-defectiveness are anticipated to be increasingly higher in the future as demanded by the device fabrication processes which are considered to be continuously improving toward higher levels of integration and density. In addition, the system according to the embodiments of the present invention is considered to be sufficiently capable of being used for forthcoming new materials such as compound semiconductors. Thus, the method and the apparatus according to the embodiments of the present invention has many technological advantages.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

what is claimed is:

1. A method of evaluating the lifetime of a semiconductor material in which the lifetime of carriers generated by injecting energy into the semiconductor material is measured to evaluate quality, said method comprising the steps of:
   radiating light within a short-wavelength region for a short period of time onto a surface of the semiconductor material to be evaluated, thereby generating carriers;
   projecting electromagnetic wave within a region corresponding to 30 to 300 GHz onto said surface;
   measuring wave reflected from said surface to obtain a decay curve of said carriers; and
   evaluating the lifetime of said surface as well as a surface thin-layer portion of the semiconductor material on the basis of said decay curve.

2. Method according to claim 1, further comprising the step of applying a negative bias to said surface or a portion in the vicinity of said surface in which carriers are to be generated.

3. An apparatus for evaluating the lifetime of a semiconductor material in which the lifetime of carriers generated by injecting energy into the semiconductor material is measured to evaluate quality, the apparatus comprising:
   a carrier-exciting light source for generating pulsed light within a short-wavelength region;
   an optical condensing system for condensing light from said carrier-excited light source and for forming an optical path through which the light is radiated onto a surface of the semiconductor material to be measured;
   a millimeter to sub-millimeter waveguide for supplying said surface with electromagnetic wave generated by a millimeter through sub-millimeter wave oscillator and for guiding a wave reflected from said surface to a reflected wave detector; and
   a signal processing circuit for processing a detection signal output by said reflected wave detector and for evaluating the lifetime of said surface as well as a surface thin-layer portion of the semiconductor material on the basis of a decay curve of said carrier,
   said millimeter through sub-millimeter wave oscillator generating an electromagnetic wave within a frequency range of 30 to 3,000 GHz.

4. The apparatus according to claim 3, further comprising negative bias application means for generating negative ions on said surface or in the vicinity of said surface of the semiconductor material.

5. The apparatus according to claim 3, further comprising strong electric-field forming power-supply means for restraining surface recombination by utilizing a natural oxide film on said surface of the semiconductor material.

6. The apparatus according to claim 3, wherein said optical condensing system includes a first optical path section for radiating light from an upper surface of the semiconductor material and a second optical path section for radiating light from a lower surface of the semiconductor material.

* * * * *